(12) United States Patent
Park et al.

(10) Patent No.: US 8,553,417 B2
(45) Date of Patent: Oct. 8, 2013

(54) HEAT-RADIATING SUBSTRATE AND METHOD OF MANUFACTURING THE SAME

(75) Inventors: Ji Hyun Park, Seoul (KR); Seog Moon Choi, Seoul (KR); Young Ki Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 166 days.

(21) Appl. No.: 13/007,545

(22) Filed: Jan. 14, 2011

(65) Prior Publication Data

US 2012/0127666 A1    May 24, 2012

(30) Foreign Application Priority Data

Nov. 23, 2010    (KR) .................. 10-2010-0116981

(51) Int. Cl.
*H05K 7/20*    (2006.01)
(52) U.S. Cl.
USPC ........... 361/720; 361/710; 257/684; 257/706; 257/717; 174/252; 174/258; 174/526
(58) Field of Classification Search
USPC .............. 361/676, 679.46, 679.54, 688, 361/701–713, 720, 748
See application file for complete search history.

(56) References Cited

U.S. PATENT DOCUMENTS

| | | | | |
|---|---|---|---|---|
| 6,045,240 A * | 4/2000 | Hochstein | ..................... | 362/294 |
| 6,477,053 B1 * | 11/2002 | Zeidan et al. | .................. | 361/719 |
| 7,916,484 B2 * | 3/2011 | Chyn et al. | .................... | 361/710 |
| 8,081,476 B2 * | 12/2011 | Tsao et al. | ..................... | 361/719 |
| 2007/0076422 A1 * | 4/2007 | Nicolai | .......................... | 362/547 |
| 2007/0194336 A1 * | 8/2007 | Shin et al. | ........................ | 257/98 |
| 2009/0194869 A1 * | 8/2009 | Eom et al. | ..................... | 257/712 |
| 2010/0195284 A1 * | 8/2010 | Zheng | ........................... | 361/697 |
| 2011/0310560 A1 * | 12/2011 | Jarmany | ........................ | 361/697 |

FOREIGN PATENT DOCUMENTS

| | | |
|---|---|---|
| JP | 2008-091814 | 4/2008 |
| JP | 2008-147208 | 6/2008 |
| JP | 2008-218938 | 9/2008 |
| JP | 2008-251671 | 10/2008 |

OTHER PUBLICATIONS

Office Action from counterpart Japanese Patent Application No. 2010-289578, mailed Sep. 25, 2012, 7 pages, English Summary included.

* cited by examiner

*Primary Examiner* — Courtney Smith
(74) *Attorney, Agent, or Firm* — Blakely Sokoloff Taylor & Zafman LLP

(57) ABSTRACT

Disclosed herein are a heat-radiating substrate and a method of manufacturing the same. The heat-radiating substrate includes: a base substrate with a heat sink, having a groove; an insulating layer formed on the base substrate by performing anodization thereon; and a circuit layer formed on the insulating layer, whereby the heat-radiating substrate with the heat-sink, made of metal material, is manufactured, thereby making it possible to protect devices weak against heat and thus solve the problem in view of reduced life span and degraded reliability.

2 Claims, 3 Drawing Sheets

HEAT-RADIATING SUBSTRATE AND METHOD OF MANUFACTURING THE SAME

CROSS REFERENCE TO RELATED APPLICATION

This application claims the benefit of Korean Patent Application No. 10-2010-0116981, filed on Nov. 23, 2010, entitled "Heat-Radiating Substrate And Method Of Manufacturing The Same", which is hereby incorporated by reference in its entirety into this application.

BACKGROUND OF THE INVENTION

1. Technical Field

The present invention relates to a heat-radiating substrate and a method of manufacturing the same.

2. Description of the Related Art

With the increase in electronic components used for vehicles, industries or the like, and the trend in multi-functions and miniaturization, a problem arises in that a plurality of electronic components should be integrated on a small-area of the substrate.

In addition, a problem arises in that heat-radiation according to the driving of the electronic components affects the performance of the electronic components.

For example, in the case of a metal printed circuit board according to the prior art, an insulating layer has low thermal conductivity, and as a result, when it is applied to a heating device used for high power, it causes a problem in driving the device due to the low thermal conduction. In addition, in the case of devices (an IC, a passive device, or the like) that should be protected from high temperature other than the heating device, they have problems in view of a short life span and extended reliability due to high temperature.

Therefore, a need exists for a technology development of preventing the performance of the electronic components from being degraded by including a heat-radiating system in a field of manufacturing the substrate.

SUMMARY OF THE INVENTION

The present invention has been made in an effort to provide a heat-radiating substrate capable of protecting devices weak against heat by manufacturing a substrate with a heat-sink, made of a metal material, and a method of manufacturing the same.

In addition, the present invention has been made in an effort to provide a heat-radiating substrate capable of rapidly transferring the heat generated from devices to the outside by manufacturing a substrate with a heat-sink by performing anodization on the heat-radiating substrate, without using an adhesive used in bonding the existing heat-sink, and a method of manufacturing the same.

In addition, the present invention has been made in an effort to provide a heat-radiating substrate having a groove for easily disposing a printed circuit board mounted with a device, and a method of manufacturing the same.

According to a preferred embodiment of the present invention, there is provided a heat-radiating substrate, including: a base substrate with a heat sink, having a groove; an insulating layer formed on the base substrate by performing anodization thereon; and a circuit layer formed on the insulating layer.

The heat-radiating substrate may further include a printed circuit board disposed on the top of the groove; and a device mounted on the printed circuit board.

The groove may have a shape corresponding to the volume of the printed circuit board.

The base substrate may include: a flat-plate shaped heat-sink base part; and a heat-sink pin protruded from one surface of the heat-sink base part, having a projection shape.

The base substrate may be made of an aluminum material.

According to a preferred embodiment of the present invention, there is provided a method of manufacturing a heat-radiating substrate, including: providing a base substrate with a heat-sink, having a groove; forming an insulating layer on the base substrate by performing anodization thereon; and forming a circuit layer on the insulating layer.

The providing the base substrate may manufacture the base substrate having the groove by extruding or pressing a metal for a base substrate.

The providing the base substrate may further include: forming a flat-plate shaped heat-sink base part; and forming a heat-sink pin protruded from one surface of the heat-sink base part, having a projection shape.

The providing the base substrate may include: manufacturing an original plate made of a metal for base substrate; and manufacturing the groove by performing a wet-etching on the original plate.

The providing the base substrate may further include: forming a flat-plate shaped heat-sink base part; and forming a heat-sink pin protruded from one surface of the heat-sink base part, having a projection shape.

The method of manufacturing a heat-radiating substrate may further include disposing the printed circuit board mounted with a device on the top of the groove.

The groove may be formed to have a shape corresponding to the volume of the printed circuit board.

The base substrate is made of an aluminum material.

DESCRIPTION OF THE PREFERRED EMBODIMENTS

Figure 1:
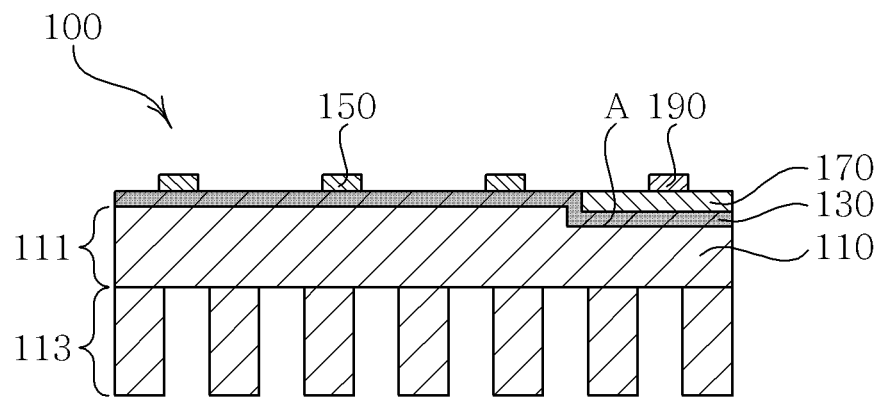
FIG. 1 is a cross-sectional view showing a configuration of a heat-radiating substrate according to the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, a detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Heat-Radiating Substrate

FIG. 1 is a cross-sectional view showing a configuration of a heat-radiation substrate according to the present invention.

As shown in FIG. 1, a heat-radiating substrate 100 is configured to include a base substrate 110, an insulating layer 130 formed on the base substrate 110, a circuit layer 150 formed on the insulating layer 130, and a printed circuit board 170 formed on the insulating layer 130.

In more detail, the base substrate 110 with a heat-sink may be formed, having a groove A.

In this configuration, the base substrate 110 may include a flat-plate shaped heat-sink base part 111 and a heat-sink pin 113 protruded from one surface of the heat-sink base part 111, having a projection shape.

As shown in FIG. 1, the groove A may be formed on one surface of the heat-sink base part 111.

In addition, the base substrate 110 may be made of an aluminum material.

In the base substrate 110 with the heat-sink, the heat-radiating substrate is formed integrally with the heat-sink part. Therefore, the base substrate 110 with the heat-sink may solve the problem of the prior art that since the heat-radiating substrate and the heat-sink part are each provided, an adhesive bonding thereof is used to degrade the heat-radiating characteristics and thus does not make the heat transfer smooth. Therefore, the heat-radiating characteristics can be improved and the devices that may bring a short life span and degrade reliability due to the heat-radiation can be disposed.

The insulating layer 130 may be formed on the base substrate 110 by performing anodization thereon.

The circuit layer 150 may be formed on the insulating layer 130.

The printed circuit board 170 may be disposed on the top of the groove A.

A device 190 may be mounted on the printed circuit board 170.

In this configuration, the device includes devices (for example, an IC, a passive device, or the like) that are weak against high temperature but is not limited thereto and all kinds of devices may be used.

In addition, the groove A may have a shape corresponding to the volume of the printed circuit board 170.

As shown in FIG. 1, the groove A is a space for bonding the printed circuit board 170 on which a device that is weak against high temperature is mounted. The groove A is formed to have a shape such that the printed circuit board 170 can be easily aligned and machined during the bonding process.

Owing to the groove A having a step structure, the printed circuit board 170 can be easily mounted on the base substrate 110 and bonding stability between the base substrate 110 and the printed circuit board can be improved.

In addition, although not shown, when the printed circuit board 170 mounted with the devices 190 that are weak against heat is disposed on the groove A, it is bonded using an adhesive or the like. The reason is that the devices weak against heat are mounted on the printed circuit board 170 on the base substrate 110 which serves as a heat-sink, and as a result, the devices are not exposed to high temperature due to the adhesive and the thermal characteristics of the printed circuit board, thereby making it possible to maintain the life span and secure reliability.

Method of Manufacturing a Heat-Radiating Substrate

Figure 2:
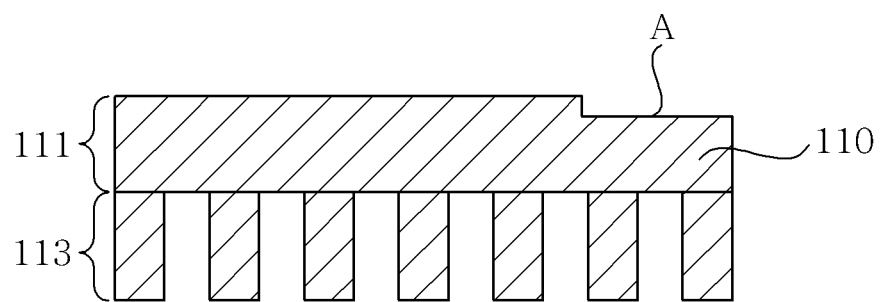
FIGS. 2 to 4 are cross-sectional views sequentially showing a manufacturing process of a heat-radiating substrate according to the present invention.
Figure 3:
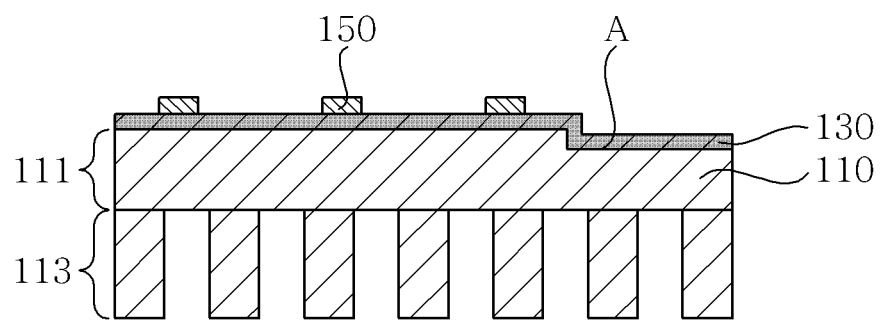
Figure 4:
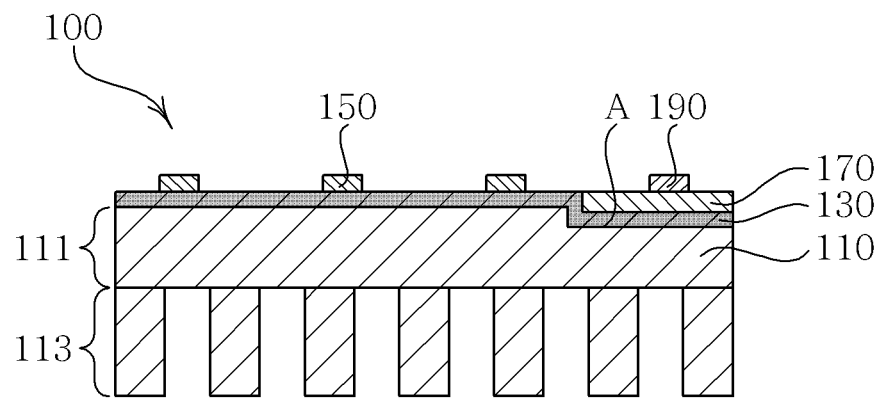
Figure 5:
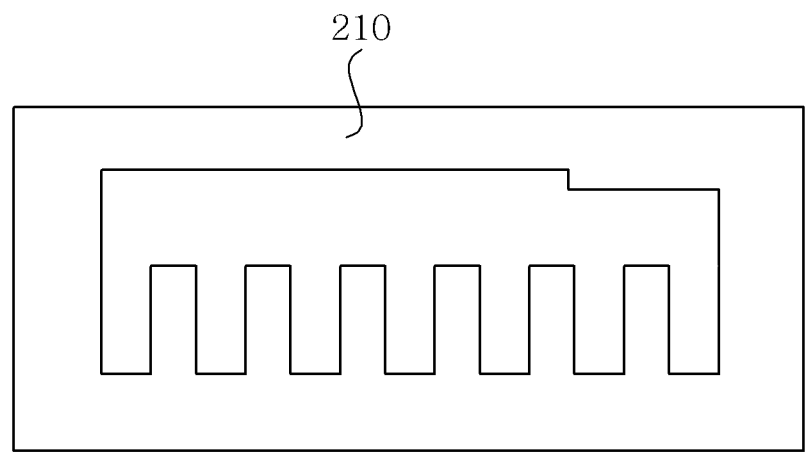
FIGS. 5 to 7 are cross-sectional views explaining a method of manufacturing a base substrate according to the present invention.
Figure 6:
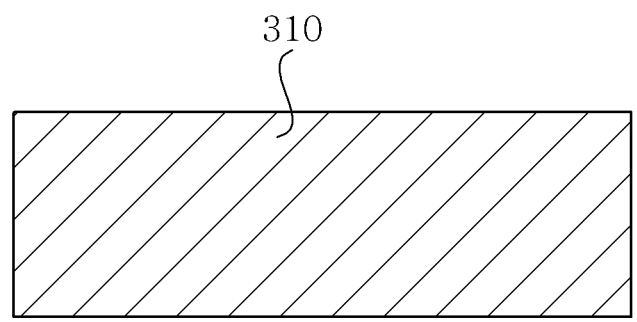
Figure 7:
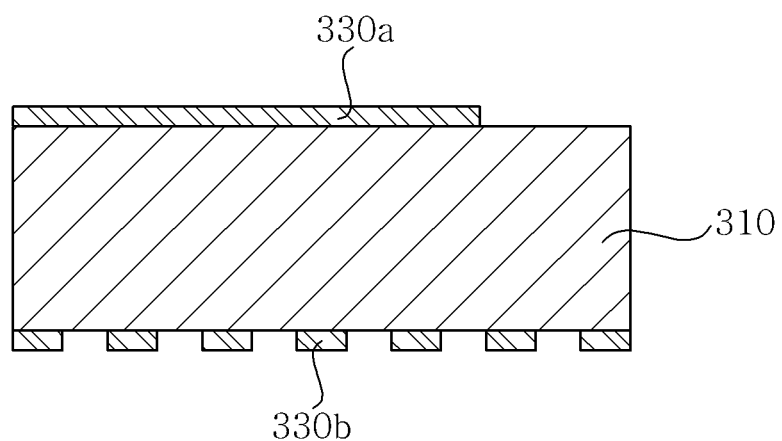

FIGS. 2 to 4 are cross-sectional views sequentially showing a manufacturing process of a heat-radiating substrate according to the present invention, and FIGS. 5 to 7 are cross-sectional views explaining a method of manufacturing a base substrate according to the present invention.

First, as shown in FIG. 2, a base substrate 110 with a heat-sink, having a groove A, is provided.

In this case, the groove A is formed to have a shape corresponding to the volume of a printed circuit board 170. In addition, the base substrate 110 may be made of an aluminum material.

Meanwhile, the base substrate 110 may be manufactured to have a groove A by performing an extrusion process or a press process on a metal for the base substrate.

In this case, as shown in FIG. 2, the base substrate 110 may include a flat-plate shaped heat-sink base part 111 and a heat-sink pin 113 protruded from one surface of the heat-sink base part 111, having a projection shape. The heat-sink pin 113 having a projection shape is a structure for improving the heat-radiating characteristics of the heat-radiating substrate.

In more detail, as shown in FIG. 5, the extrusion method is applied in which a mold 210 having a shape of the heat-sink base part 111, the heat-sink pin 113, and the groove A is formed and then a melted metal (for example, aluminum) is discharged through the mold 210, thereby manufacturing the base substrate 110.

According to the press process, aluminum is pressed by the mold 210, thereby manufacturing the base substrate 110.

Meanwhile, a wet-etching method may also be applied, in addition to the method of using the mold 210.

In more detail, the groove A in the base substrate 110 may be manufactured by manufacturing an original plate 310 made of a metal for base substrate and performing wet-etching on the original plate.

In this case, as shown in FIG. 2, the base substrate 110 may include a flat-plate shaped heat-sink base part 111 and a heat-sink pin 113 protruded from one surface of the heat-sink base part 111, having a projection shape.

For example, as shown in FIGS. 6 and 7, the original plate 310 made of a metal material (for example, aluminum) is etched using dry film photoresist (DFR), a photoresist (PR), or the like as a mask, according to a shape corresponding to the etching. In this case, the original plate 310 may be subjected to a pretreatment or the like using an etchant, as needed.

When the masking process is completed, the base substrate 110 with the heat-sink is manufactured and masks 330a and 330b are removed by the wet-etching method.

When the top and the bottom are required to have shapes each having a different depth, the etching may be performed twice by etching the bottom at the time of a primary masking and etching the top at the time of a secondary masking.

As shown in FIG. 3, an insulating layer 130 is formed on the base substrate 110 manufactured through the process as described above by performing anodization thereon.

In addition, a circuit layer 150 may be formed on the insulating layer.

As shown in FIG. 4, a printed circuit board 170 mounted with a device 190 may be disposed on the top of the groove A.

According to one aspect of the present invention, the substrate with a heat-sink, made of a metal material, is manufactured, thereby making it possible to protect devices weak against heat and thus solve the problem in view of reduced life span and degraded reliability.

According to another aspect of the present invention, the substrate with a heat-sink is manufactured by performing anodization on the heat-radiating substrate, without using an adhesive used to bond the existing heat sink, thereby making it possible to rapidly transfer the heat generated from the device to the outside.

According to still another aspect of the present invention, the groove for disposing the printed circuit board mounted with the device is formed in the heat-radiating substrate, thereby making it possible to easily mount the device weak against heat on the substrate.

Although the preferred embodiments of the present invention have been disclosed for illustrative purposes, they are for specifically explaining the present invention and thus a heat-radiating substrate and a method of manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A heat-radiating substrate, comprising:
   a base substrate with a heat sink, having a groove;
   an insulating layer formed on the entire top surface of the base substrate by performing anodization thereon; and
   a circuit layer formed on the insulating layer;
   a printed circuit board disposed on the top of the groove; and,
   a device mounted on the printed circuit board.

2. The heat-radiating substrate as set forth in claim 1, wherein the groove has a shape corresponding to the volume of the printed circuit board.

* * * * *